(12) United States Patent
Ohde et al.

(10) Patent No.: US 6,326,676 B1
(45) Date of Patent: *Dec. 4, 2001

(54) SEMICONDUCTOR DEVICE

(75) Inventors: Tomoshi Ohde; Yukio Asami, both of Kanagawa; Hirotaka Kobayashi, Tokyo, all of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,875

(22) Filed: May 12, 1997

(30) Foreign Application Priority Data

May 14, 1996 (JP) .................................................... 8-119164

(51) Int. Cl.$^7$ .................................................. H01L 23/544
(52) U.S. Cl. ........................................... 257/620; 438/462
(58) Field of Search .............................. 257/620; 438/462

(56) References Cited

U.S. PATENT DOCUMENTS 4,610,079 * 9/1986 Abe et al. ............................... 29/583
5,136,354 * 8/1992 Morita et al. ......................... 257/635
5,530,280 * 6/1996 White ................................... 257/508
5,763,936 * 6/1998 Yamaha et al. ...................... 257/620
5,834,829 * 11/1998 Dinkel et al. ........................ 257/620

FOREIGN PATENT DOCUMENTS

6077315 * 3/1994 (JP) ..................................... 257/620

\* cited by examiner

Primary Examiner—Mark V. Prenty
(74) Attorney, Agent, or Firm—Sonnenschein, Nath & Rosenthal

(57) ABSTRACT

On the scribe line area formed between a plurality of semiconductor chip areas on a semiconductor wafer, there is provided a chipping preventing portion constituted by a double groove consisting of the first and second grooves. Thus, the entry of chipping into the semiconductor chip area is prevented when dicing the semiconductor wafer along the scribe line area provided between each of the semiconductor chip areas. In this respect, an insulating film may be formed on the surface of the semiconductor wafer on the side of an element forming area.

4 Claims, 4 Drawing Sheets

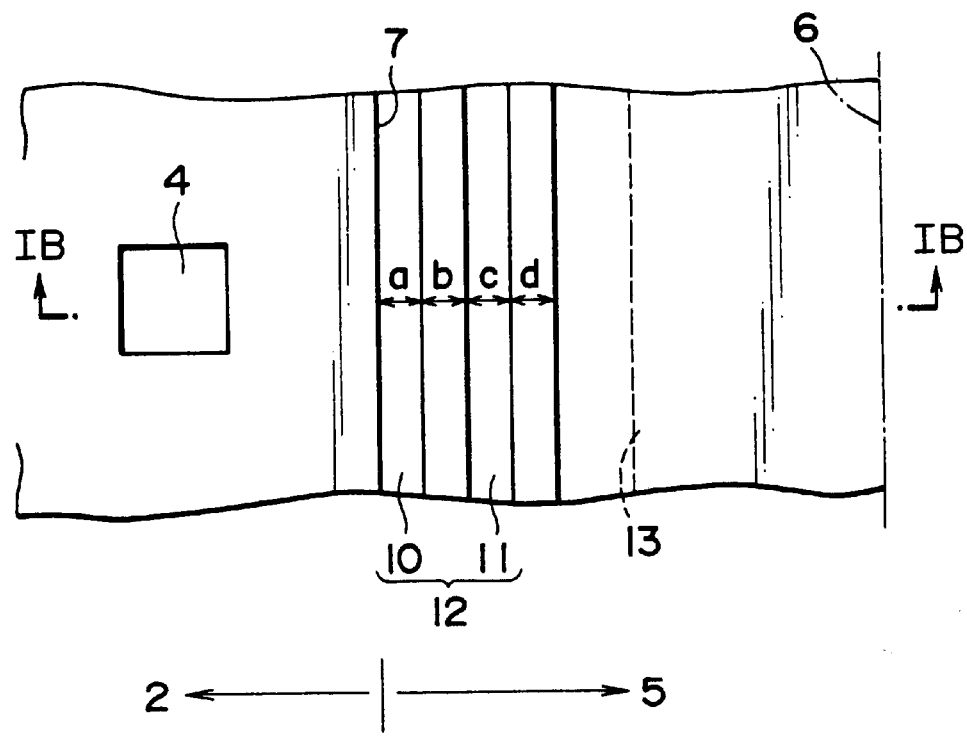
FIG. IA
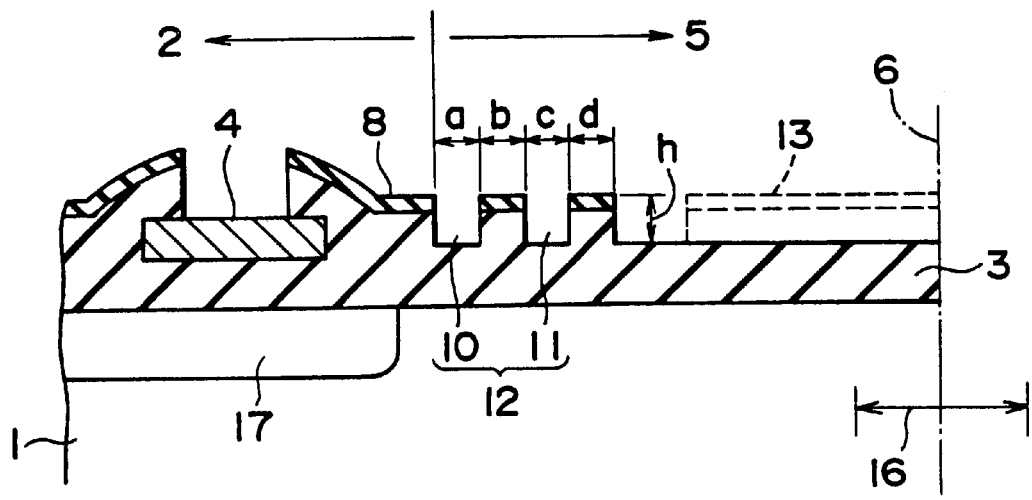
FIG. IB

SEMICONDUCTOR DEVICE

BACKGROUND OF THE INVENTION

The present invention relates to a semiconductor device, and more particularly to a semiconductor device diced along a scribe line area between a plurality of semiconductor chip areas.

A semiconductor device such as IC or LSI is manufactured using a semiconductor wafer obtained by slicing a semiconductor single crystal ingot as the starting material. More specifically, after forming a plurality of semiconductor chip areas on a semiconductor wafer by effecting various processes for the semiconductor wafer, dicing is effected along the scribe line area formed between semiconductor chip areas to thereby divide into individual semiconductor chips for using them to assemble the semiconductor device.

A dicing blade is used to divide the semiconductor wafer into semiconductor chips. This diamond blade is obtained by causing diamond particles to adhere to a surface, which becomes the cutting portion of a round grindstone having a thickness of scores μm through such adhesive material as a nickel plating layer, and the diamond particles are pressed against the semiconductor wafer while revolving at as high speeds as ten thousands rpm to cut along the scribe line area. Since heat is generated during the dicing operation, the operation is performed while cooling by pouring water over the semiconductor wafer.

FIG. 5 is a plan view for explaining conventional dicing, and FIG. 6 is a cross-sectional view taken on line VI—VI in FIG. 5.

In FIGS. 5 and 6, numeral 1 designates a semiconductor wafer; 2, a semiconductor chip area formed on the semiconductor wafer 1; and 3, an insulating protective film consisting of oxide (SiO2) for protecting the surface of each semiconductor chip area 2 and the like, and this insulating protective film 3 is actually formed to have multilayer film structure. Numeral 4 designates a pad electrode consisting of Al and the like formed at a desired position on each semiconductor chip area 2; 5, a scribe line area formed between each of the semiconductor chip areas 2; 6, a scribe center; 7, a scribe edge; and 8, an over-coated film consisting of a nitride film (SiN) covering the pad electrode 4 and the scribe line area 5, and the like. In this respect, numeral 13 designates a pattern for process monitor called "Scribe TEG (Test Element Group)", which may be formed and may not be formed.

The dicing is started by positioning a dicing blade in the scribe center 6 of the scribe line area 5 to press it against the semiconductor wafer 1 in FIGS. 5 and 6. During the dicing, it is performed in a state in which the semiconductor wafer 1 is fixed by an appropriate supporting jig, and after dicing in one direction (for example, X direction) of the semiconductor wafer 1 is completed, dicing in another direction (for example, Y direction) is performed. After dicing in the X and Y directions is completed, the semiconductor wafer 1 is divided into individual semiconductor chips by releasing the fixed state by the supporting jig. Numeral 16 designates an example of an actual width for cutting using the dicing blade.

In a conventional semiconductor device, when a semiconductor wafer is divided by dicing, there is a problem in which indeterminate rupture, so-called chipping occurs along the edge of the cutting line of the semiconductor wafer in contact with the dicing blade.

This chipping occurs and causes a chipping portion indicated by numeral 9 in FIG. 5. When the chipping portion 9 enters the semiconductor chip area 2 from the scribe line area 5, there is a possibility that the semiconductor chip divided by dicing does not properly operate, becoming a defective element in the worst case.

To this end, there has been conceived a counter measure to prevent chipping from occurring by removing the over-coated film in the scribe line area to directly dice the surface of the semiconductor wafer. According to this proposal, however, since the scribe line area is exposed, when wire bonding is effected for the semiconductor chip after completion of the dicing, there is a drawback that the wire comes into contact with a part of the scribe line area to cause a short-circuit, etc.

Also, recently, there has been generally arranged a pattern 13 for process monitor called a "Scribe TEG (Test Element Group)" within the scribe line area for the purpose of shrinking the chip, but since this TEG is formed by stacking an insulating film and a conductive film, it causes the dicing blade to be clogged during dicing, and further causes chipping to easily occur. To avoid this, it is good enough to enlarge the width of the scribe line area, but in this case, it is not desirable because this runs counter to the chip shrinkage.

SUMMARY OF THE INVENTION

The present invention has been achieved to solve such problems, and its object is to prevent chipping from entering the semiconductor chip area when the semiconductor wafer is diced along the scribe line area provided between each of the semiconductor chip areas.

A semiconductor device according to the present invention is characterized in that a portion of the scribe line area on the side of the semiconductor chip area has been provided with a chipping preventing portion.

According to a semiconductor device of the present invention, the chipping preventingportion has been provided in the scribe line area formed between a plurality of semiconductor chip areas on a semiconductor wafer, and therefore, it is possible to prevent the entry of chipping into the semiconductor chip area, by the chipping preventing portion, which is likely to occur when dicing the semiconductor wafer along the scribe line area provided between each of the semiconductor chip areas.

BRIEF DESCRIPTION OF THE DRAWINGS

FIGS. 1A and 1B are views showing a first embodiment of a semiconductor device according to the present invention; FIG. 1A is a plan view and FIG. 1B is a cross-sectional view taken on line IB—IB in FIG. 1A.

DETAILED DESCRIPTION OF THE PREFERRED EMBODIMENTS

Figure 2A:
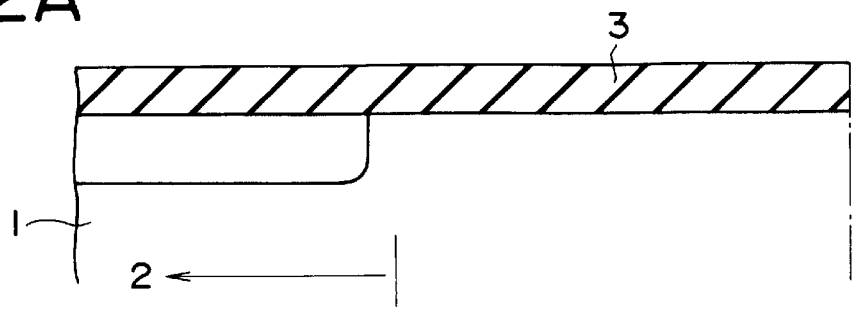
FIGS. 2A to 2D are cross-sectional views showing a method of manufacturing the semiconductor device shown in FIG. 1 in the process order.

Hereinafter, the present invention will be described in detail in accordance with the embodiments shown.

FIGS. 1A and 1B are views showing the first embodiment of a semiconductor device according to the present invention; FIG. 1A is a plan view and FIG. 1B is a cross-sectional view taken on line IB—IB in FIG. 1A.

In FIGS. 1A and 1B, numeral 1 designates a semiconductor wafer consisting of, for example, Si; 2, a semiconductor chip area formed on the semiconductor wafer 1; and 3, an insulating protective film consisting of oxide ($SiO_2$) for protecting the surface of each semiconductor chip area 2 and the like, and this insulating protective film 3 is actually formed to have multilayer film structure. Numeral 4 designates a pad electrode consisting of Al and the like formed at a desired position on each semiconductor chip area 2; 5, a scribe line area formed between each of the semiconductor chip areas 2; 6, a scribe center; 7, a scribe edge; and 8, an over-coated film consisting of a nitride film (SiN) covering the insulating protective film 3 and the like.

The over-coated film 8 within the scribe line area 5 is provided with a chipping preventing portion 12 consisting of a double groove of a first groove 10 and a second groove 11 formed in the outside thereof. Also, on the scribe center 6 portion, there is arranged a TEG area 13.

The width from the scribe center 6 to the scribe edge 7 of the scribe line area 5 is set to, for example, about 65 μm. The width a of the first groove 10 is set to, for example, about 4 μm, the width c of the second groove 11 is set to, for example, about 4 μm, the width b of the overcoated film 8 between the first and second grooves 10 and 11 is set to, for example, about 4 μm, and the width d of the overcoated film 8 in the outside of the second groove 11 is set to, for example, about 5 μm. The depth h of the first and second grooves 10 and 11 is set to, for example, about 1 μm. Numeral 16 designates a width to be actually cut by the dicing blade.

Thus, with the provision of the chipping preventing portion 12 consisting of a double groove of the first groove 10 and the second groove 11 formed in the outside thereof in the overcoated film 8 of the scribe line area 5, chipping is prevented from entering the semiconductor chip area 2 even if the chipping occurs when the semiconductor wafer 1 is divided by dicing.

Next, FIGS. 2A to 2D are cross-sectional views showing the method of manufacturing the semiconductor device shown in FIG. 1 in the process order.

First, as shown in FIG. 2A, there is prepared a semiconductor wafer 1 consisting of, for example, Si on which a plurality of semiconductor chip areas 2 have been formed. The semiconductor wafer 1 is covered with the insulating protective film 3 consisting of oxide (SiO2) and the like.

Figure 2B:
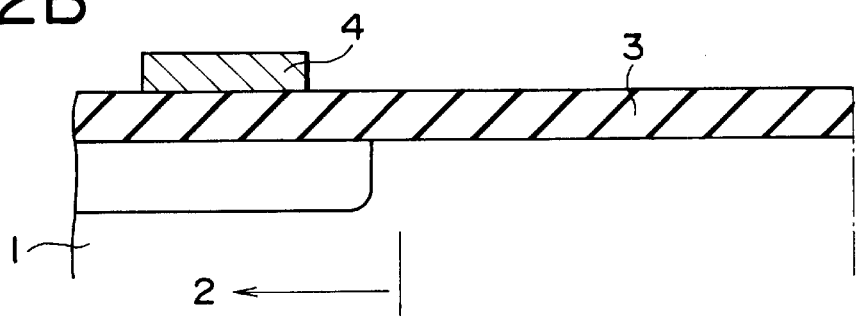

Next, as shown in FIG. 2B, the pad electrode 4 consisting of aluminum Al and the like is formed at a desired position on each semiconductor chip area 2 on the semiconductor wafer 1. This pad electrode 4 can be easily formed by the widely known photolithography process after an Al film is formed over the entire surface by the widely known CVD method, PVD method or the like.

Figure 2C:
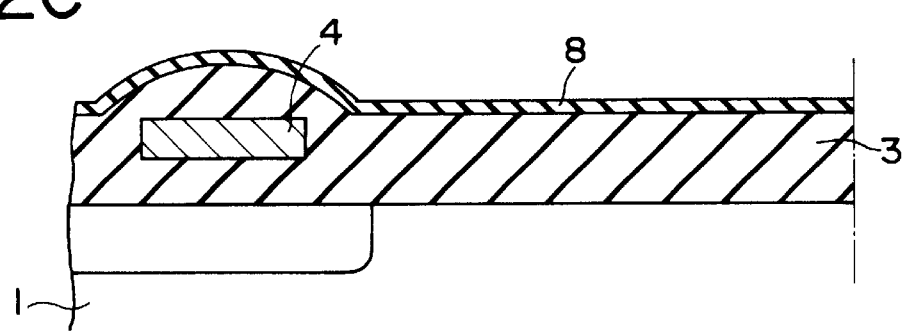

Subsequently, as shown in FIG. 2C, after the surface of each semiconductor wafer 1 containing the pad electrode 4 is covered with oxide or the like, this oxide is further covered with the overcoated film 8 consisting of the nitride film (SiN) and the like. This overcoated film 8 can be easily formed by the widely known CVD method, PVD method or the like as described above. The overcoated film 8 formed on the surface of the pad electrode 4 is configured in the slightly swollen form by the thickness of the pad electrode 4.

Figure 2D:
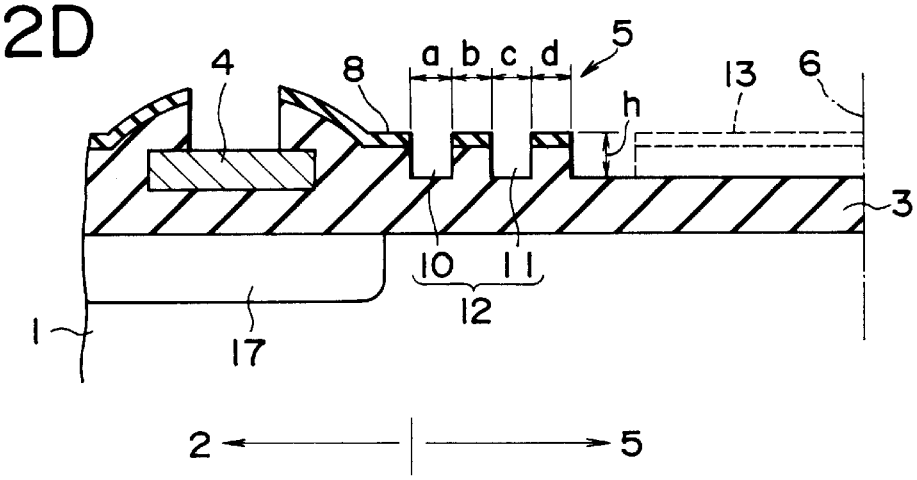

Then, as shown in FIG. 2D, the overcoated film 8 on the surface of the pad electrode 4 is removed and at the same time, the overcoated film 8 on the surface of the scribe line area 5 provided between each of the semiconductor chip areas 2 is selectively removed to form a first groove 10 and a second groove 11 which constitute the chipping preventing portion 12. This chipping preventing portion 12 can be easily formed by the widely known photolithography process as described above.

Thus, as shown in FIG. 1, there are formed the first groove 10 about 4 μm in width a, the second groove 11 about 4 μm in width c, an overcoated film 8 about 4 μm in width b between the first and second grooves 10 and 11, and an overcoated film 8 about 5 μm in width d in the outside of the second groove 11. Also, the depth h of each groove 10, 11 is set to about 1 μm.

Figure 3:
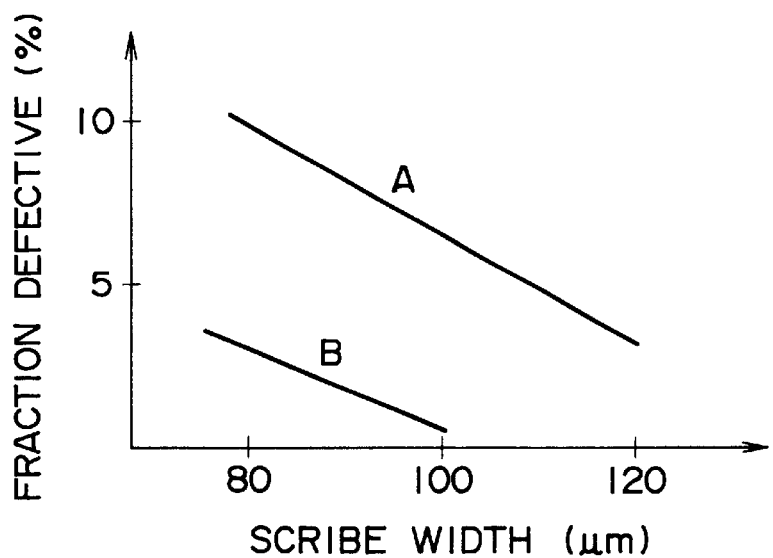
FIG. 3 is a characteristic diagram for explaining the effect obtained by the semiconductor device of the first embodiment.

FIG. 3 is a characteristic diagram for explaining the effect obtained by a semiconductor device according to the present invention; the ordinate represents fraction defective (%) and the abscissa represents scribe width (μm), and the characteristic A indicates the case of a conventional structure while the characteristic B indicates the case of the structure of the present invention. As can be seen from this characteristic diagram of FIG. 3, as the scribe width in the abscissa is increased, the fraction defective can be lowered. According to the present invention, the fraction defective with respect to the same scribe width is noticeably lower than the conventional case.

According to such a semiconductor device of the present invention, a chipping preventing portion 12 consisting of a double groove of the first groove 10 and the second groove 11 has been provided in the scribe line area 5 formed between a plurality of semiconductor chip areas 2 on a semiconductor wafer 1, and therefore, the entry of chipping-into the semiconductor chip area 2 can be prevented when the semiconductor wafer 1 is diced along the scribe line area 5 provided between each of the semiconductor chip areas 2.

Figure 4:
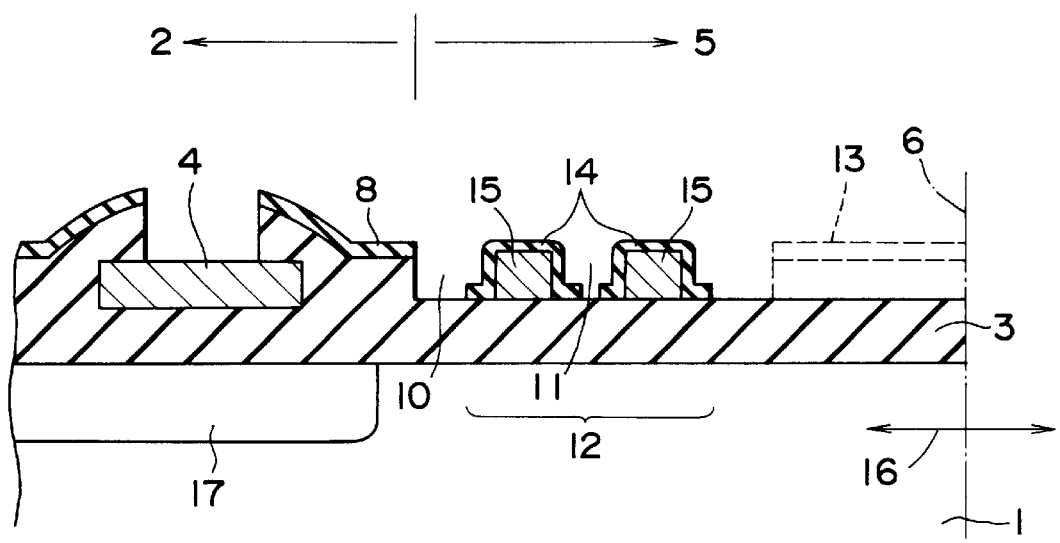
FIG. 4 is a cross-sectional view showing a second embodiment of a semiconductor device according to the present invention.
Figure 5:
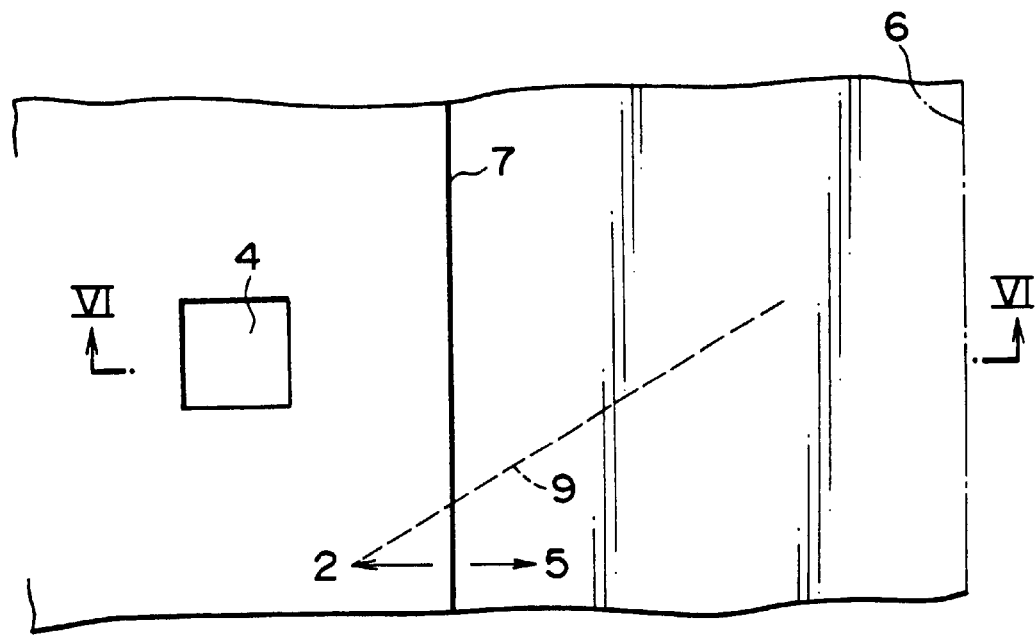
FIG. 5 is a plan view showing a conventional semiconductor device.
Figure 6:
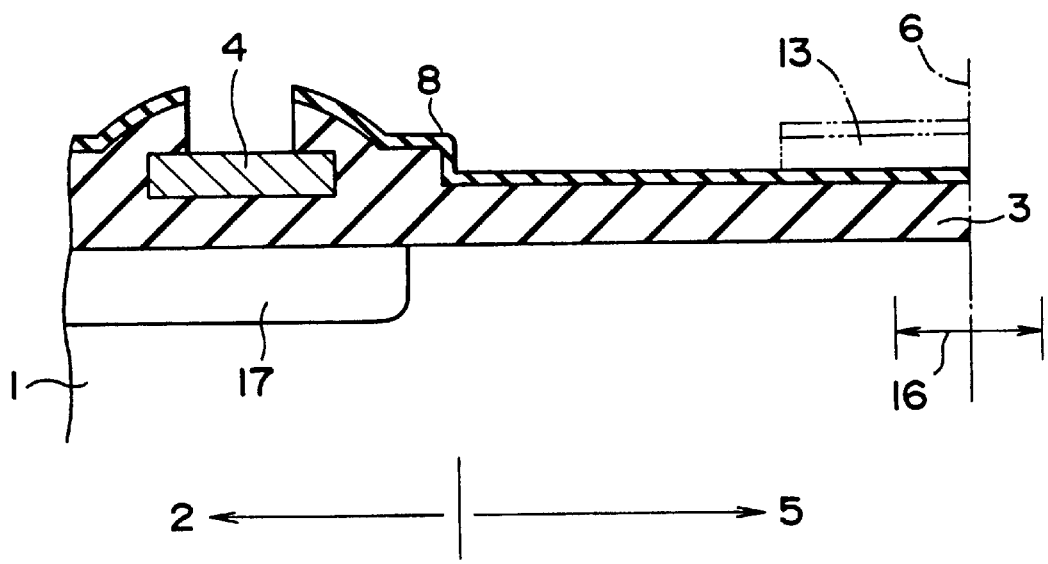
FIG. 6 is a cross-sectional view taken on line VI—VI in FIG. 5.

FIG. 4 is a cross-sectional view showing the second embodiment of a semiconductor device according to the present invention.

This embodiment is different from the first embodiment in that the chipping preventing portion 12 consists of protrusions 14 and 14, but is the same in the other points, and only the different point will be described because the same points have been already described.

Numerals 14 and 14 designate protrusions constituting the chipping preventing portion 12 in this embodiment, and are formed by swelling the overcoated film 8 through a conductive film 15 consisting of Al and the like formed on the insulating protective film 3.

Since this conductive film 15 can be formed simultaneously with a process of forming the pad electrode 4 as described above, it is not necessary to add any special process. Numerals 10 and 11 designate grooves caused by the formation of these protrusions 10 and 11.

Thus, according to this embodiment, in the same manner as the first embodiment, a chipping preventing portion 12 consisting of a so-called double film of a plurality of protrusions 14 and 14 has been provided in the scribe line area 5 formed between a plurality of semiconductor chip areas 2 on a semiconductor wafer 1, and therefore, it is possible to prevent the entry of chipping into the semiconductor chip area 2 when dicing the semiconductor wafer 1 along the scribe line area 5 provided between each of the semiconductor chip areas 2.

In addition, according to semiconductor devices of each embodiment, since the chipping preventing portion 12 is constituted by the double groove consisting of the first groove 10 and the second groove 11 or the double film consisting of protrusions 14 and 14, measures can be taken in accordance with the degree of chipping in the process management in such a manner that when chipping occurred stops at the second groove 11 in the outside, the product is judged as non-defective, while when it stops at the first groove 10 on the edge side, it is judged as defective. Therefore, it becomes possible to improve the process management.

In this respect, in each embodiment as described above, the chipping preventing portion 12 has been constituted by a double groove 10. 11 or a double film 14, 14, but is not always restricted to the double groove or double film, but the present invention is applicable also to a form of one groove 10 or film 14. Also, triple or more grooves or films may be formed. Also, the materials for the insulating protective film 3 and the overcoated film 8 do not always require to be the same as those for the above-described embodiments, but any materials can be used if only such a material is replaceable. Further, as regards widths of the scribe line area 5, grooves 10, 11, protrusions 14, 14 and the like, those in the above-described embodiments only show an example, and can be changed according to the required conditions.

As described above, according to a semiconductor device of the present invention, a chipping preventing portion has been provided in the scribe line area formed between a plurality of semiconductor chip areas on a semiconductor wafer, and therefore, it is possible to prevent the entry of chipping into the semiconductor chip area when dicing the semiconductor wafer along the scribe line area provided between each of the semiconductor chip areas.

What is claimed is:

1. A semiconductor wafer, comprising:
   a semiconductor chip area in which a semiconductor device is formed;
   a scribe line area in which a cut is made at a scribe center to separate said semiconductor chip area from a remainder of said wafer, said scribe line area including an insulating film;
   a scribe edge between said semiconductor chip area and said scribe line area; and
   a chipping preventing portion in said scribe line area, said chipping preventing portion positioned between said scribe edge and said scribe center and comprising a plurality of exposed grooves in said insulating film.

2. A semiconductor wafer as claimed in claim 1, wherein said semiconductor chip area includes an insulating film.

3. A semiconductor wafer, comprising:
   at least two semiconductor devices formed in said wafer, said semiconductor devices being separated from adjacent semiconductor devices by a scribe line area, said scribe line area including an insulating film; and
   a chipping preventing portion in said scribe line area, said chipping preventing portion positioned between a scribe edge and a scribe center, wherein said chipping preventing portion comprises at least one exposed protrusion formed of a layer consisting of a single metal layer on the surface of said insulating film;
   wherein said scribe center is located in an area past an outer edge of said protrusion, said outer edge being located in a direction away from a semiconductor chip area.

4. A semiconductor wafer as claimed in claim 3, wherein said at least one protrusion is a plurality of protrusions.

* * * * *